United States Patent [19]

Telfer et al.

[11] Patent Number: 5,681,676
[45] Date of Patent: Oct. 28, 1997

[54] REGISTRATION METHOD

[75] Inventors: Stephen J. Telfer; Michael J. Zuraw, both of Arlington, Mass.

[73] Assignee: Polaroid Corporation, Cambridge, Mass.

[21] Appl. No.: 121,045

[22] Filed: Oct. 20, 1993

Related U.S. Application Data

[62] Division of Ser. No. 881,125, May 11, 1992, Pat. No. 5,279,912.

[51] Int. Cl.[6] ............................................ G03F 9/00
[52] U.S. Cl. .................... 430/22; 430/332; 430/333; 430/945; 430/946; 430/964; 359/463
[58] Field of Search ............................ 430/333, 332, 430/945, 964, 321, 946, 22; 359/463; 354/112

[56] References Cited

U.S. PATENT DOCUMENTS

| | | | |
|---|---|---|---|
| 3,715,212 | 2/1973 | Ross | 430/21 |
| 3,895,867 | 7/1975 | Lo et al. | 355/77 |
| 4,063,265 | 12/1977 | Lo et al. | 354/294 |
| 4,132,468 | 1/1979 | Lo et al. | 353/7 |
| 4,364,627 | 12/1982 | Haines | 350/3.76 |
| 4,480,893 | 11/1984 | Fantone | 350/132 |

(List continued on next page.)

FOREIGN PATENT DOCUMENTS

| | | |
|---|---|---|
| 2185825 | 3/1987 | United Kingdom. |
| WO 90/00978 | 5/1992 | WIPO. |

OTHER PUBLICATIONS

Davies et al., Three-dimensional imaging systems: a new development, Applied Optics, 27(21), 4520 (1988).

Fukuyama, NTT Developing 3-D Video Display for use in Videophones, Home TV, The Japan Economic Journal, Dec. 1990.

Higuchi et al., Real-time transmission of 3-D images formed by parrallax panoramagrams, Applied Optics, 17(24), 3895 (1978).

Li Yang et al., Discussion of the optics of a new 3-D imaging system, Applied Optics, 27(21), 4529 (1988).

Love et al., Computer Generated Lenticular Stereograms, SPIE, 1083, 102 (1989).

Meyers, Stephan et al., New advances in computer-generated barrier-strip autostereography, SPIE 1256, 312-321 (1990).

(List continued on next page.)

*Primary Examiner*—John A. McPherson
*Attorney, Agent, or Firm*—David J. Cole

[57] ABSTRACT

A three-dimensional image is produced using an imaging medium having a lenticular screen, the lenticles of the screen dividing the opposed surface of the imaging medium into a plurality of elongate image areas, the imaging medium having on the opposed side thereof a radiation-sensitive layer, the radiation-sensitive layer comprising a color-forming composition adapted to undergo a change of color upon increase in the temperature of the radiation-sensitive layer above a color-forming temperature for a color-forming time. The radiation-sensitive layer is imagewise exposed to actinic radiation which does not pass through the lenticular screen, thereby causing the color-forming composition to undergo its change in color in exposed areas and to form in the radiation-sensitive layer a composite image, the composite image comprising, in each of the image areas, a plurality of image strips extending lengthwise along the image area, each of the image strips containing information from a view of the object, each of the plurality of image strips in one image area containing information from a different view of the object thereby forming a copy of the composite image in the radiation-sensitive layer, so that a three-dimensional orthoscopic image of the object will appear to an observer seeing the composite image in the radiation-sensitive layer through the lenticular screen.

4 Claims, 4 Drawing Sheets

U.S. PATENT DOCUMENTS

| | | | |
|---|---|---|---|
| 4,506,296 | 3/1985 | Marraud et al. | 358/88 |
| 4,557,954 | 12/1985 | Gundlach et al. | 428/29 |
| 4,588,899 | 5/1986 | Erhardt | 250/491.1 |
| 4,602,263 | 7/1986 | Borrer et al. | 346/201 |
| 4,650,282 | 3/1987 | Lo | 350/130 |
| 4,669,812 | 6/1987 | Hoebing | 350/3.73 |
| 4,720,449 | 1/1988 | Borrer et al. | 430/338 |
| 4,720,450 | 1/1988 | Ellis | 430/339 |
| 4,737,840 | 4/1988 | Morishitar | 358/3 |
| 4,745,046 | 5/1988 | Borrer et al. | 430/332 |
| 4,765,656 | 8/1988 | Becker et al. | 283/70 |
| 4,778,262 | 10/1988 | Haines | 350/3.66 |
| 4,826,976 | 5/1989 | Borrer et al. | 544/58.4 |
| 4,834,512 | 5/1989 | Austin | 350/419 |
| 4,859,027 | 8/1989 | Kishida | 350/128 |
| 4,903,069 | 2/1990 | Lam | 355/22 |
| 4,935,335 | 6/1990 | Fotland | 430/324 |
| 4,960,901 | 10/1990 | Borrer et al. | 548/207 |
| 4,969,700 | 11/1990 | Haines | 350/3.66 |
| 4,987,487 | 1/1991 | Ichiniose et al. | 358/92 |
| 5,004,335 | 4/1991 | Montes | 352/58 |
| 5,024,699 | 6/1991 | Llyama et al. | 106/21 |
| 5,028,950 | 7/1991 | Fritsch | 355/22 |
| 5,049,987 | 9/1991 | Hoppenstein | 358/88 |
| 5,077,178 | 12/1991 | Herbert et al. | 430/340 |
| 5,113,213 | 5/1992 | Sandor et al. | 355/22 |
| 5,192,645 | 3/1993 | Boggs et al. | 430/338 |
| 5,276,478 | 1/1994 | Morton | 355/22 |
| 5,278,608 | 1/1994 | Taylor et al. | 355/22 |

OTHER PUBLICATIONS

Patent Abstracts of Japan, 12(12), Abstract 62–170040, Published Jan. 1, 1988.

Sandin, Daniel J. et al., Computer–generated barrier–strip autostereography, SPIE 1083, 65–75 (1989).

Smith, C.W., New advances in 3D imagery, Brit. J. photog., (1989), 14.

Valyus, N.A., Stereoscopy, Focal Press, London, pp. 195–207.

REGISTRATION METHOD

This application is a division of application Ser. No. 07/881,125, filed May 11, 1992 now U.S. Pat. No. 5,279,912.

REFERENCES TO RELATED APPLICATIONS

Copending application Ser. No. 07/695,641, filed May 6, 1991, describes and claims thermal imaging media having the bubble-suppressant layer shown in FIG. 2 of the accompanying drawings.

Copending application Ser. No. 07/696,196, filed May 6, 1991, describes and claims thermal imaging media having a color-forming layer with a high glass transition temperature, and at least one diffusion-reducing layer, as shown in FIG. 2 of the accompanying drawings.

U.S. Pat. No. 5,153,169 describes and claims imaging media having a color-forming layer containing a hindered amine light stabilizer or a nitrone as a color stabilizer, as used in the imaging medium shown in FIG. 2 of the accompanying drawings.

U.S. Pat. No. 5,231,190 describes and claims the infra-red dye of formula:

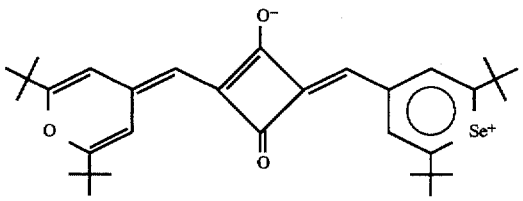

used in the thermal imaging medium of the present invention shown in FIG. 2 of the accompanying drawings.

Copending application Ser. No. 07/277,014, filed Nov. 28, 1988, describes and claims the yellow leuco dye used in the thermal imaging medium of the present invention shown in FIG. 2 of the accompanying drawings.

Copending application Ser. No. 07/795,038, filed Nov. 20, 1991, describes and claims certain bis(benzpyrylium) infra-red dyes, including the croconate dye used in the radiation-sensitive layer described below with reference to FIG. 2 of the accompanying drawings.

U.S. Pat. No. 5,227,408 describes and claims certain amino-substituted squarylium infra-red dyes, including the dyes of Formulae IR2, IR3 and IR5 used in the radiation-sensitive layer described below with reference to FIG. 2 of the accompanying drawings.

The disclosures of all the aforementioned patents and copending applications are herein incorporated by reference.

BACKGROUND OF THE INVENTION

Modern computer drawing and modelling programs (usually known as "computer assisted design" or "CAD" programs) can display complicated three-dimensional objects in great detail, can generate shadows showing the appearance of the object in various types and directions of lighting, and permit the observer to rotate the three-dimensional object about any axis, so that he can see any desired aspect of the object. So realistic are the images produced by sophisticated CAD programs that it is difficult for the user not to believe that he is watching a real object rather than just a computer simulation of a non-existent object. (Hereinafter for convenience, the term "real object" will be used to denote an object which physically exists in space-time, while the term "virtual object" will be used to denote a model which exists only as a mathematical construct in a computer.)

Unfortunately, when the user of a CAD program wishes to produce a hard copy of a three-dimensional virtual object, he finds that most available forms of output are essentially two-dimensional. Typically, the user will generate a hard copy of his results as a series of two-dimensional sections through the object. While such a series of sections may be convenient for preparing working drawings for manufacture of the corresponding real object, such a series does not readily convey an idea of the three-dimensional structure of the virtual object to most observers, particularly those not skilled in interpreting technical drawings.

Alternatively a series of images of the virtual object (showing, for example, rotation of the object about one or more axes) may be recorded on video tape. However, not only is special equipment needed to convert computer data to conventional video standards, but the resultant video images are typically of low resolution, and restrict an observer of the tape to watching a series of two-dimensional views of the virtual object chosen and fixed by the program's user, rather than allowing the observer to choose his own selection and sequence of views of the virtual object.

Holographic techniques can of course record full details of a three-dimensional virtual object and permit an observer to view the hologram as if it were a three-dimensional real object. However, holographic recording requires the use of a laser, and holograms of a type which can be viewed in white light display distracting color changes as the parallax of the hologram is observed.

Various techniques are known for recording three-dimensional images in lenticular media having one or more photosensitive layers. As early as 1908, Gabriel Lippman invented a method for producing a true three-dimensional image of a scene with vertical and horizontal parallax; see, for example, De Montebello, "Processing and Display of Three-Dimensional Data II" in Proceedings of SPIE, San Diego, 1984. In Lippman's method, a photographic plate is exposed through a "fly's eye" lens sheet, so that each lenslet forms a miniature image of the scene being reproduced, as seen from the perspective of the point on the sheet occupied by that lenslet. After the photographic plate has been developed, an observer looking at the composite image on the plate through the lenticular sheet sees a three-dimensional representation of the scene photographed; this representation will be in color if a color plate is used. If a lenticular sheet using hemicylindrical elongate lenticles is used instead of a fly's eye sheet, a similar three-dimensional image is seen, but this image has parallax in only one direction, across the length of the lenticles.

Unfortunately, because in Lippman's method the composite image has to be viewed from the same side of the lenticular screen as that on which the scene photographed originally stood, and because the image formed by the lenticles during exposure of the plate has undergone only a single inversion of each miniature image, the three-dimensional representation produced is pseudoscopic, that is to say the depth perception in the image is inverted so that the object appears "inside out". To overcome this problem, a number of variations of Lippman's method have been devised to achieve two inversions of each miniature image in order to provide an orthoscopic ("right side out") three-dimensional image; see, for example, U.S. Pat. No. 3,895,867. However, most of these variations of Lippman's method are complex, involving multiple exposures with a single camera, or multiple cameras or multi-lens cameras to record a plurality of views of the same object, and require extremely accurate registration of multiple images to provide a single three-dimensional image. Moreover, any method for producing three-dimensional images which relies upon conventional cameras necessarily requires the presence of a real object before the camera, and such a method is ill-adapted for producing three-dimensional images of a virtual object, since it is highly undesirable to have to produce a real copy of the virtual object merely in order to effect the imaging process.

Thus, there is a need for a method of producing a three-dimensional image of an object which can readily be applied to imaging of virtual objects without a need to first produce a real copy of the object.

SUMMARY OF THE INVENTION

This invention provides a method for the production of a three-dimensional image of an object, which method comprises:

(a) providing an imaging medium having on one surface thereof a lenticular screen, the lenticles of the screen dividing the opposed surface of the imaging medium into a plurality of elongate image areas, the imaging medium having on the opposed side thereof a radiation-sensitive layer, the radiation-sensitive layer comprising a color-forming composition adapted to undergo a change of color upon increase in the temperature of the radiation-sensitive layer above a color-forming temperature for a color-forming time; and (b) imagewise exposing the radiation-sensitive layer to actinic radiation which does not pass through the lenticular screen, thereby causing the color-forming composition to undergo its change in color in exposed areas and to form in the radiation-sensitive layer a composite image, the composite image comprising, in each of the image areas, a plurality of image strips extending lengthwise along the image area, each of the image strips containing information from a view of the object, each of the plurality of image strips in one image area containing information from a different view of the object, whereby a three-dimensional orthoscopic image of the object will appear to an observer seeing the composite image in the radiation-sensitive layer through the lenticular screen.

(This method may hereinafter be referred to as the "three-dimensional imaging method" of the present invention.)

This invention also provides an exposed imaging medium bearing a three-dimensional image, the imaging medium having on one surface thereof a lenticular screen, and on the opposed surface thereof a radiation-sensitive layer having exposed and unexposed areas, the unexposed areas comprising a color-forming composition adapted to undergo a change of color upon increase in the temperature of the radiation-sensitive layer above a color-forming temperature for a color-forming time, and the exposed areas comprising a colored material resulting from exposure of the color-forming composition to heat, the exposed and unexposed areas being such that a three-dimensional orthoscopic image of the object will appear to an observer seeing the image in the radiation-sensitive layer through the lenticular screen.

This invention also provides an imaging medium having on one surface thereof a lenticular screen, and on the opposed surface thereof a radiation-sensitive layer, the radiation-sensitive layer comprising a color-forming composition adapted to undergo a change of color upon increase in the temperature of the radiation-sensitive layer above a color-forming temperature for a color-forming time.

Finally, this invention provides a method for printing an image on a lenticular sheet in registration with the lenticles thereof, the image comprising a plurality of image areas each of which is to be printed in register with a lenticle of the lenticular sheet, the method comprising:

providing, on the surface of the lenticular sheet remote from the lenticles, a radiation-sensitive layer, the radiation-sensitive layer being sensitive to radiation of a first wavelength but essentially insensitive to radiation of a second wavelength;

passing a first beam of radiation of the second wavelength through the lenticular screen, and detecting the periodic variation of the radiation on the side of the imaging medium bearing the radiation-sensitive layer;

scanning a second beam of radiation of the first wavelength over the radiation-sensitive layer without passing the second beam through the lenticles of the lenticular sheet while modulating the intensity of the second beam, thereby imagewise exposing the radiation-sensitive layer to produce the image, the modulation of the second beam being controlled in dependence upon the detected periodic variation so that each image area of the image is formed in register with a lenticle of the lenticular sheet.

(This method may hereinafter be referred to as the "registration method" of the present invention.)

DETAILED DESCRIPTION OF THE INVENTION

Figure 1:
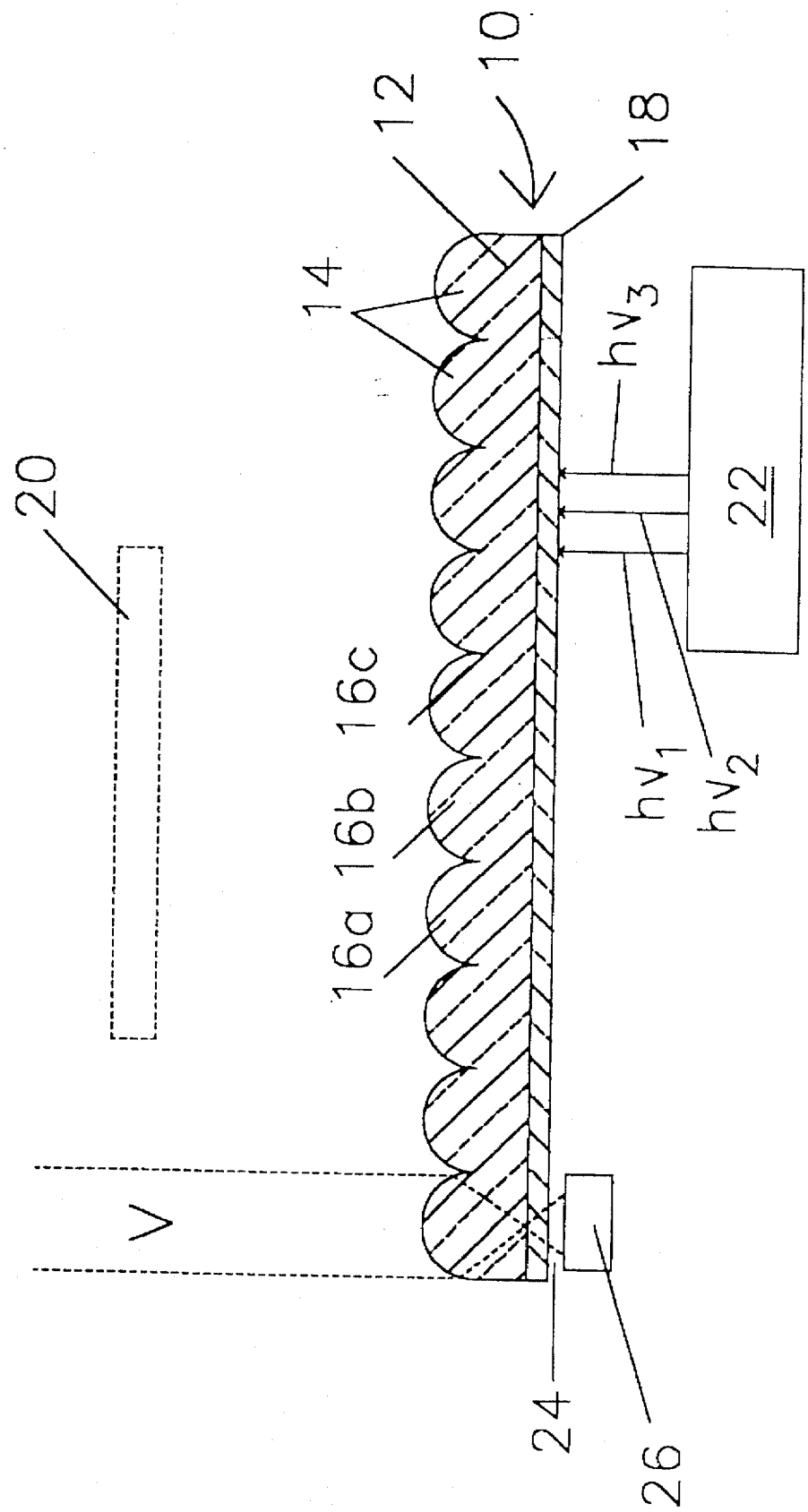
FIG. 1 of the accompanying drawings is a schematic cross section through part of an imaging medium of the present invention, and illustrates both the three-dimensional imaging method and the registration method of the present invention.

As already mentioned, the three-dimensional imaging method of the present invention uses an imaging medium having on one surface thereof a lenticular screen; this screen is regarded as dividing the opposed surface of the imaging medium into a plurality of elongate image areas. On the opposed side of the imaging medium is provided a radiation-sensitive layer comprising a color-forming composition adapted to undergo a change of color upon increase in the temperature of the radiation-sensitive layer above a color-forming temperature for a color-forming time. The radiation-sensitive layer is imagewise exposed to actinic radiation which does not pass through the lenticular screen, thereby causing the color-forming composition to undergo its change in color in exposed areas and to form in the radiation-sensitive layer a composite image. This composite image comprises, in each of the image areas, a plurality of image strips extending lengthwise along the image area, each of the image strips containing information from a view of the object, each of the plurality of image strips in one image area containing information from a different view of the object, such that an observer seeing the composite image through the lenticular screen will see a three-dimensional orthoscopic image of the object appearing behind the imaging medium.

From the preceding paragraph, it will be seen that, in the three-dimensional imaging method of the present invention, imagewise exposure of the radiation-sensitive layer is effected with the radiation-sensitive layer affixed to the lenticular screen, so that the composite image is formed in situ on the imaging medium in alignment with the lenticles of the screen. Forming the image in this manner eases the problem of accurately registering (aligning) the image formed on the radiation-sensitive layer with the lenticles of the screen; this registration problem causes great difficulty in certain prior art methods for forming three-dimensional images, which prior art methods rely upon first forming an image on a radiation sensitive medium separate from a lenticular screen, and then affixing the image to the screen in registration with the lenticles thereon. Moreover, as described in more detail below, the three-dimensional imaging and registration methods of the present invention can be used simultaneously to achieve accurate registration of the image with the lenticles.

A variety of techniques known to persons skilled in the art of three-dimensional imaging may be used to determine the correct image strips to be included in the composite image written on the radiation-sensitive layer in the three-dimensional imaging method of the present invention. In one of the simpler techniques (described in more detail below with reference to FIGS. 3 and 4, and also generally described in Love et al., Computer Generated Lenticular Stereograms, SPIE, 1083, 102 (1989)), a plurality of two-dimensional images of the object from various positions are determined (by optical methods or by calculation), each of these two-dimensional images is separated into a plurality of strips equal in number to the number of lenticles behind which the composite image is to be written, and one strip from each two-dimensional image (appropriately reduced in width to allow for maintenance of the correct aspect ratio of the object) is placed in each of the image areas.

Other techniques which are useful for, or can be modified to be useful for, determination of the strips in the composite image are described in, inter alia:

Valyus, N. A., Stereoscopy, Focal Press, London, pp. 195–207;

Davies et al., Three-dimensional imaging systems: a new development, Applied Optics, 27(21), 4520 (1988);

Li Yang et al., Discussion of the optics of a new 3-D imaging system, Applied Optics, 27(21), 4529 (1988);

Higuchi et al., Real-time transmission of 3-D images formed by parallax panoramagrams, Applied Optics, 17(24), 3895 (1978); and C. W. Smith, New advances in 3D imagery, Brit. J. Photog., (1989), 14.

Although these various techniques differ in detail, most of them are equivalent to determining the images of a three-dimensional object lying in front of a lenticular imaging medium which could be formed by each lenticle on the image area lying immediately behind that lenticle (i.e., determining the images actually formed in Lippman's method) and then laterally reversing the image thus formed in each image area across the longitudinal center line of that image area (this lateral inversion ensuring that the three-dimensional image seen by an observer looking through the lenticles at the composite image is orthoscopic rather than pseudoscopic).

Although, at least in theory, the determination of the image strips to be included in the composite image used in the three-dimensional imaging method of the present invention could be carried out by purely optical methods (or by a combination of optical and mathematical methods, for example forming a series of two-dimensional images of the object from various positions by direct optical imaging of the object, scanning the resultant images to produce digital forms thereof, and combining the resultant digital images mathematically), the present invention is primarily intended for producing three-dimensional images of virtual objects produced by computer modelling or similar programs, and thus the determination of the image strips is desirably carried out by mathematical manipulation of the virtual object. Those skilled in the art of computer modelling are well aware of techniques for generating the necessary image strips; for example, if the image strips are to be generated by combining parts of various views of a virtual object, as described above, the various views are projections of the object on to various planes, and the ability to produce such projections is a routine feature of CAD programs. Also, techniques for assembling the parts of the various views into the composite image are well within the ability of those skilled in the art of image processing.

As in any three-dimensional imaging method which relies upon the formation of multiple image strips, the realism of the three-dimensional image produced by the present three-dimensional imaging method is affected by the number of image strips in each image area, and it is preferred that there be at least four image strips in each image area. To achieve more realistic parallax, it has been found desirable that the angular difference between adjacent views combined to produce the three-dimensional image not exceed about 6°, and thus to enable a wide range of views of the object to be seen from the three-dimensional image, it is desirable to use more than four image strips, for example, ten to twenty image strips in each image area. However, increasing the number of image strips necessarily decreases the width of each image strip (which is equal to the spacing between adjacent lenticles divided by the number of image strips) and hence reduces the number of pixels which can be accommodated within the width of a single image strip. This number of pixels affects the resolution of the image seen, and hence it may be necessary to strike a balance between the number of image strips in each image area (and hence the realism of the parallax of the image) and the resolution of the image. As noted below, it is one of the advantages of the preferred color-forming compositions for use in the present three-dimensional imaging method that they are capable of producing very high resolution images, in excess of 3000 lines per inch (in excess of 120 lines/mm).

It should be noted that, in contrast to Lippman's method and optical modifications thereof, the angular range of views, which can be combined into the composite image used in the three-dimensional imaging method of the present invention (and which can thus be seen by an observer viewing the three-dimensional image), is not limited by the "field of view" of the lenticles. In Lippman's method, only the portion of the image formed by each lenticle which falls within the image area of that lenticle is effective in producing the three-dimensional image, since only the portion of the image formed by each lenticle which lies within the associated imaging area is seen through that lenticle by the observer; portions of the image formed by each lenticle which lie outside the associated imaging area effectively only produce "noise" in the three-dimensional image. Thus, in Lippman's method, the angular spread of images which contribute to the three-dimensional image is restricted by the finite extent of the image area of each lenticle, and so is the range of view of the object which can be seen in the three-dimensional image produced. If the angular range of views included in an image produced by the three-dimensional imaging method of the present invention exceeds the range which could be included by Lippman's method, the parallax of the three-dimensional image will be false in that the object will appear to move as the observer observes various views thereof, but the full angular range of views can still be seen by the observer.

The images produced by the present method may be either monochromatic or polychromatic. Polychromatic images are produced in a manner similar to that employed in other polychromatic imaging media, namely by providing a radiation-sensitive layer comprising at least two radiation-sensitive sub-layers sensitive to radiation of differing wavelengths, and, in step (b), imagewise exposing the radiation-sensitive layer to actinic radiation of two differing wavelengths to form images in the two radiation-sensitive sub-layers, so that a multicolored image is formed in the radiation-sensitive layer. Full color images may be achieved using three sub-layers, which typically will form yellow, cyan and magenta images, as in a conventional silver halide color film. Normally, the various radiation-sensitive sub-layers will be laid down one on top of the other within the radiation-sensitive layer, so that the sub-layers will be at differing distances from the lenticular sheet. Care should be taken to ensure that the sub-layers are not so thick that the realism of the three-dimensional image seen is affected by this spacing between the sub-layers. The preferred color-forming compositions for use in the three-dimensional imaging method of the present invention can yield high optical densities of about 3.0 using radiation-sensitive layers of the order of 1 μm thick.

Desirably, the imagewise exposure of the radiation-sensitive layer in step (b) is effected by scanning a beam of radiation (preferably a laser beam) across the radiation-sensitive layer, and modulating the intensity of the beam to provide the imagewise variation in exposure. The use of a laser beam is not only well suited for recording in a scanning mode but, by utilizing a highly concentrated beam, exposure can be concentrated in a small area so that it is possible to record at high speed, high resolution and high density. Also, the use of a scanned laser beam is a convenient way to record data in response to transmitted signals, such as the digitized information form in which the image information will typically be generated by the present method.

The three-dimensional imaging method of the present invention uses a radiation-sensitive layer comprise a color-forming composition adapted to undergo a change of color upon increase in the temperature of the radiation-sensitive layer above a color-forming temperature for a color-forming time. The preferred color-forming compositions described below can be caused to undergo their color change with essentially no change in dimensions of the radiation-sensitive layer. In contrast, conventional silver halide emulsions tend to shrink during development, and this shrinkage is highly disadvantageous in that it might affect registration of the composite image with the lenticles. In addition, the preferred color-forming compositions described below do not require any development steps, and thus avoid exposure of the lenticular screen to developing chemicals such as might occur if a silver halide material were used. Appropriate color-forming compositions for use in the three-dimensional imaging method of the present invention are described in, for example, U.S. Pat. Nos. 4,602,263; 4,720,449; 4,720,450; 4,745,046; 4,826,976; and 4,960,901, the disclosures of which are herein incorporated by reference.

Preferred color-forming compositions for use in the present three-dimensional imaging method are:

a. an organic compound capable of undergoing, upon heating, an irreversible unimolecular fragmentation of at least one thermally unstable carbamate moiety, this organic compound initially absorbing radiation in the visible or the non-visible region of the electromagnetic spectrum, said unimolecular fragmentation visibly changing the appearance of the organic compound (see U.S. Pat. No. 4,602,263);

b. a substantially colorless di- or triarylmethane imaging compound possessing within its di- or triarylmethane structure an aryl group substituted in the ortho position to the meso carbon atom with a moiety ring-closed on the meso carbon atom to form a 5- or 6-membered ring, said moiety possessing a nitrogen atom bonded directly to said meso carbon atom and said nitrogen atom being bound to a group with a masked acyl substituent that undergoes fragmentation upon heating to liberate the acyl group for effecting intramolecular acylation of said nitrogen atom to form a new group in the ortho position that cannot bond to the meso carbon atom, whereby said di- or triarylmethane compound is rendered colored (see U.S. Pat. No. 4,720,449);

c. a colored di- or triarylmethane imaging compound possessing within its di- or triarylmethane structure an aryl group substituted in the ortho position to the meso carbon atom with a thermally unstable urea moiety, said urea moiety undergoing a unimolecular fragmentation reaction upon heating to provide a new group in said ortho position that bonds to said meso carbon atom to form a ring having 5 or 6 members, whereby said di- or triarylmethane compound becomes ring-closed and rendered colorless (see U.S. Pat. No. 4,720,450);

d. in combination, a substantially colorless di- or triarylmethane compound possessing on the meso carbon atom within its di- or triarylmethane structure an aryl group substituted in the ortho position with a nucleophilic moiety which is ring-closed on the meso carbon atom, and an electrophilic reagent which upon heating and contacting said di- or triarylmethane compound undergoes a bimolecular nucleophilic substitution reaction with said nucleophilic moiety to form a colored, ring-opened di- or triarylmethane compound (see U.S. Pat. No. 4,745,046);

e. a compound of the formula

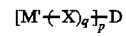

wherein M' has the formula:

wherein R is alkyl; —$SO_2R^1$ is alkyl; phenyl; naphthyl; or phenyl substituted with alkyl, alkoxy, halo, trifluoromethyl, cyano, nitro, carboxy, —$CONR^2R^3$ wherein $R^2$ and $R^3$ each are hydrogen or alkyl, —$CO_2R^4$ wherein $R^4$ is alkyl or phenyl, —$COR^5$ wherein $R^5$ is amino, alkyl or phenyl, —$NR^6R^7$ wherein $R^6$ and $R^7$ each are hydrogen or alkyl, —$SO_2NR^8R^9$ wherein $R^8$ and $R^9$ each are hydrogen, alkyl or benzyl; Z' has the formula:

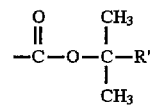

wherein R' is halomethyl or alkyl; X is —N=, —$SO_2$— or —$CH_2$—; D taken with X and M' represents the radical of a color-shifted organic dye; q is 0 or 1; and p is a whole number of at least 1; said Z' being removed from said M' upon the application of heat to effect a visually discernible change in spectral absorption characteristics of said dye (see U.S. Pat. No. 4,826,976);

f. a substantially colorless di- or triarylmethane compound of the formula:

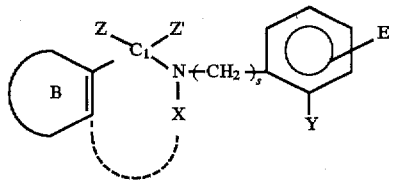

wherein ring B represents a carbocyclic aryl ring or a heterocyclic aryl ring; $C_1$ represents the meso carbon atom of said di- or triarylmethane compound; X represents —C(=O)—; —SO$_2$— or —CH$_2$— and completes a moiety ring-closed on said meso carbon atom, said moiety including the nitrogen atom bonded directly to said meso carbon atom; Y represents —NH—C(=O)—L, wherein L is a leaving group that departs upon thermal fragmentation to unmask —N=C=O for effecting intramolecular acylation of said nitrogen atom to open the N-containing ring and form a new group in the ortho position of ring B that cannot bond to said meso carbon atom; E is hydrogen, an electron-donating group, an electron-withdrawing group or a group, either an electron-donating group or an electron-neutral group that undergoes fragmentation upon heating to liberate an electron-withdrawing group; s is 0 or 1; and Z and Z' taken individually represent the moieties to complete the auxochromic system of a diarylmethane or triarylmethane dye when said N-containing ring is open, and Z and Z' taken together represent the bridged moieties to complete the auxochromic system of a bridged triarylmethane dye when said N-containing ring is open (see U.S. Pat. No. 4,960,901);

g. a colorless precursor of a preformed image dye substituted with (a) at least one thermally removable protecting group that undergoes fragmentation from said precursor upon heating and (b) at least one leaving group that is irreversibly eliminated from said precursor upon heating, provided that neither said protecting group nor said leaving group is hydrogen, said protecting and leaving groups maintaining said precursor in its colorless form until heat is applied to effect removal of said protecting and leaving groups whereby said colorless precursor is converted to an image dye (see International Patent Application No. PCT/US89/02965 (Publication No. WO 90/00978), U.S. Pat. No. 5,192,645, and copending application Ser. No. 07/729,426, filed Jul. 12, 1991;

h. a mixed carbonate ester of a quinophthalone dye and a tertiary alkanol containing not more than about 9 carbon atoms (see U.S. Pat. No. 5,243,052)

i. a leuco dye represented by:

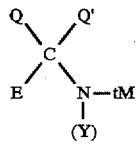

wherein:

E represents a thermally removable leaving group;

tM represents a thermally migratable acyl group;

Q, Q' and C taken together represent a dye-forming coupler moiety wherein C is the coupling carbon of said coupler moiety;

and, (Y) taken together with N represents an aromatic amino color developer, one of said Q, Q' and (Y) containing an atom selected from the atoms comprising Group 5A/Group 6A of the Periodic Table, said groups E and tM maintaining said leuco dye in a substantially colorless form until the application of heat causes said group E to be eliminated from said leuco dye and said group tM to migrate from said N atom to said Group 5A/Group 6A atom thereby forming a dye represented by:

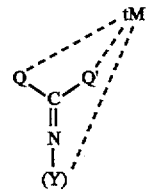

wherein said dotted lines indicate that said tM group is bonded to said Group 5A/Group 6A atom in one of said Q, Q' and (Y) (see U.S. Pat. No. 5,236,884).

These preferred color-forming compositions rely on a chemical reaction with a substantial activation energy to form a covalent bond for color formation, rather than upon a diffusion-controlled reaction, for example between an electron-donating compound (color former) and an electron-accepting compound (color developer). Thus, these preferred color-forming compositions can be in the form of a single phase composition which is essentially stable at room temperature but which forms color when heated above its color-forming temperature for a color-forming time, in contrast to certain thermal imaging systems which contain two separate phases, each of which contains one component of a two-component color-forming system, such that admixing of the two phases will result in color formation at any temperature, these two phases being arranged not to diffuse into one another at room temperature but to diffuse into one when the two phase system, as for example by rupture of the walls of microcapsules in which one of the phases is encapsulated.

As described in the patents mentioned above, these preferred color-forming compositions are capable of producing very high resolution images which require no development, and thus these color-forming compositions are well-suited to imaging in situ in the method of the present invention. Furthermore, as already mentioned the imaging process produces essentially no change in the dimensions of the color-forming composition, thus avoiding any problems in maintaining registration of the three-dimensional image with the lenticular screen.

As already mentioned, the imagewise exposure step of the present method is conveniently effected using a laser. In the present state of technology, solid state diode infra-red lasers emitting at about 700 to 1200 nm, preferably 800 to 1200 nm, provide the highest output per unit cost, and thus are desirably used in the present process, especially since the output from such solid state diodes can be shaped by optical methods into a elongate spot only about 3–5 μm in its short dimension by about 20 μm in its long dimension, and such an elongate spot is well-suited for use in the present method. (Because of the elongate lenticles and elongate image strips used in the present method, resolution across the image strips is much more important than resolution along the strips, and resolution across the strips can be maximized by orienting the elongate laser spot with its short dimension disposed across the image strips and its long dimension along the image strips.)

Since most of the preferred color-forming compounds do not absorb strongly in the infra-red, in the imaging medium of the present invention the radiation-sensitive layer desirably comprises an absorber capable of absorbing infra-red radiation and thereby generating heat in the radiation-sensitive layer. The heat thus generated is transferred to the color-forming compound to initiate the color-forming reaction and effect the change in the absorption characteristics of the color-forming compound from colorless to colored. Obviously, the infra-red absorber (which may also be referred to hereinafter as an "infra-red dye") should be in heat-conductive relationship with the color-forming compound, for example, in the same layer as the color-forming compound or in an adjacent layer. Though an inorganic compound may be employed, the infra-red absorber preferably is an organic compound, such as a cyanine, merocyanine, squarylium, thiopyrylium or benzpyrylium dye, and preferably, is substantially non-absorbing in the visible region of the electromagnetic spectrum so that it will not contribute any substantial amount of color to the $D_{min}$ areas, i.e., the highlight areas of the image. The light absorbed by the respective infra-red absorbers is converted into heat and the heat initiates the reaction to effect the formation of colored compounds in the color-forming layers. Since this type of radiation-sensitive layer is imaged by infra-red radiation rather than by direct heating, a high resolution image is more easily achieved.

An especially preferred form of radiation-sensitive layer of this type has at least two sub-layers, the at least two sub-layers comprising color-forming compounds arranged to produce dye compounds having differing colors, and comprising absorbers absorbing at differing wavelengths. The infra-red absorbers are desirably selected such that they absorb radiation at different predetermined wavelengths above 700 nm sufficiently separated so that each color-forming layer may be exposed separately and independently of the others by using infra-red radiation at the particular wavelengths selectively absorbed by the respective infra-red absorbers. As an illustration, three color-forming sub-layers containing yellow, magenta and cyan color-forming compounds could have infra-red absorbers associated therewith that absorb radiation at 792 nm, 848 nm and 926 nm, respectively, and could be addressed by laser sources, for example, infra-red laser diodes, emitting laser beams at these respective wavelengths so that the three color-forming sub-layers can be exposed independently of one another. While each sub-layer may be exposed in a separate scan, it is usually preferred to expose all of the color-forming sub-layers in a single scan using multiple laser sources of the appropriate wavelengths. In such multi-color radiation-sensitive layers, the color-forming compounds may comprise the subtractive primaries yellow, magenta and cyan or other combinations of colors, which combinations may additionally include black. The leuco dyes generally are selected to give the subtractive colors cyan, magenta and yellow, as commonly employed in photographic processes to provide full natural color. A full color imaging medium of this type having three color-forming sub-layers is described below with reference to FIG. 2 of the accompanying drawings.

Where imagewise heating is induced by converting light to heat, the radiation-sensitive layer may be heated prior to or during exposure. This may be achieved using a heating platen or heated drum or by employing an additional laser source or other appropriate means for heating the radiation-sensitive layer while it is being exposed.

The preferred color-forming compositions described above are essentially insensitive to visible light. This insensitivity to visible light not only allows imaging media of the present invention comprising the preferred color compositions to be handled freely under normal room lighting, but also facilitates registration of the image with the lenticular screen using the registration method of the present invention. In this registration method, as already mentioned, to achieve registration of the image with the lenticular screen a beam of non-imaging radiation, of a wavelength which does not image the radiation-sensitive layer, is passed through the lenticular screen, and the periodic variation of the non-imaging radiation on the side of the imaging medium bearing the radiation-sensitive layer is used to control the registration of the composite image with the lenticles of the screen. Those skilled in the electronic imaging art are well aware of techniques which can be used to control the registration of the composite image with the lenticular screen depending upon the periodic variation of the non-imaging radiation which has passed through the screen. For example, a linear solid state imager could be placed on the side of the imaging medium bearing the radiation-sensitive layer with its long dimension extending across the lenticles, and the periodic variation of the non-imaging radiation detected by the solid state imager used to control timing circuits which control the modulation of the imaging laser beam. When using a near infra-red laser for imaging a radiation-sensitive layer which is essential unaffected by visible radiation, the non-imaging radiation can be visible light.

The imaging medium of the present invention can be prepared in a manner similar to the thermal imaging media described in the aforementioned U.S. patents and applications. Typically, as described in these U.S. patents, the color-forming compound and any other components of the color-forming layer (for example, a polymeric binder and an infra-red absorber) are dispersed in an appropriate solvent, and the resultant liquid dispersion is coated onto a support, generally a polymer film, using conventional coating equipment, and the resultant liquid film dried to produce the color-forming layer. To produce an imaging medium of the present invention, the coating operation may be carried out using a lenticular sheet in place of a simple polymeric film, appropriate precautions (for example, the use of rubber-coated rollers) being used if necessary to ensure that the lenticular surface of the sheet is not damaged or deformed during the coating operation. Alternatively, the radiation-sensitive layers can be coated onto a conventional support, and the resultant combination of support and radiation-sensitive layers laminated to the lenticular medium under heat and pressure or by the use of adhesives. If a relatively thick support is desired for ease of coating but the presence of such a thick support is deemed undesirable during imaging (because, for example, inevitable manufacturing variations in a thick support may make it difficult to control the depth of focus of a laser imaging micrometer thick radiation-sensitive layers), the support may comprise a strip sheet which is peeled from the radiation-sensitive layers after those layers have been laminated to the lenticular medium. Appropriate strip sheets are well-known to those skilled in the coating art; for example, the types of strip sheets used to support thin metal layers in hot strip foils may be used to support the radiation-sensitive layers. The coating operation can be carried out using conventional machinery such that the lenticular surface is not exposed to the coating composition.

Rather than a solution coating, the radiation-sensitive layer may be applied as a dispersion or an emulsion. The coating composition also may contain dispersing agents, plasticizers, defoaming agents, hindered amine light stabilizers and coating aids. In forming the radiation-sensitive layer, temperatures should be maintained below levels that will cause the color-forming reactions to occur rapidly so that the color-forming compounds will not be prematurely colored.

The imaging medium of the present invention may contain additional layers and components as described in the aforementioned U.S. patents and applications. The lenticular sheet should be sufficiently thick as to permit easy handling of the imaging medium, and may be any material that substantially retains its dimensional stability during imaging and has a refractive index sufficient to provide adequate reconstruction of the three-dimensional image. Desirably, the lenticular sheet has a thickness of at least about 50 µm. The lenticular sheet must be sufficiently transparent that it does not raise excessively the $D_{min}$ of the final image. Suitable sheets may be formed from, for example, polyethylene, polypropylene, polycarbonate, cellulose acetate, and polystyrene.

Examples of binders that may be used in the radiation-sensitive layer include poly(vinyl alcohol), poly(vinyl pyrrolidone), methyl cellulose, cellulose acetate butyrate, styrene-acrylonitrile copolymers, copolymers of styrene and butadiene, poly(methyl methacrylate), copolymers of methyl and ethyl acrylate, poly(vinyl acetate), poly(vinyl butyral), polyurethane, polycarbonate and poly(vinyl chloride). It will be appreciated that the binder selected should not have any adverse effect on the leuco dye incorporated therein and may be selected to have a beneficial effect. Also, the binder should be substantially heat-stable at the temperatures encountered during image formation and it should be transparent so that it does not interfere with viewing of the color image. Where electromagnetic radiation is employed to induce imagewise heating, the binder also should transmit the radiation intended to initiate image formation.

As explained in more detail in the aforementioned copending U.S. application Ser. No. 07/696,196, in some imaging media of the type described in the aforementioned patents, there is a tendency for one or more of the colored materials produced during imaging to diffuse out of their color-forming layers, but such undesirable diffusion of colored material can be reduced or eliminated by dispersing the leuco dye in a first polymer having a glass transition temperature of at least about 50° C., preferably at least about 75° C., and most preferably at least about 95° C. and providing a diffusion-reducing layer in contact with the color-forming layer, this diffusion-reducing layer comprising a second polymer having a glass transition temperature of at least about 50° C. and being essentially free from the color-forming composition. Desirably, the diffusion-reducing layer has a thickness of at least about 1 µm. The first polymer is desirably an acrylic polymer, preferably poly(methyl methacrylate).

As discussed in the aforementioned U.S. application Ser. No. 07/695,641, certain color-forming compounds show a tendency to form bubbles during imaging. Accordingly, the imaging medium of the present invention advantageously comprises a bubble-suppressant layer on the side of the radiation-sensitive layer remote from the lenticular sheet and having a thickness of at least about 10 µm, such that, upon imagewise increase in the temperature of the radiation-sensitive layer above the color-forming temperature for the color-forming time, in heated regions the radiation-sensitive layer undergoes its change of color but remains essentially free from bubbles.

Other layers which may be included in the imaging medium of the present invention are, for example, a subbing layer to improve adhesion of the radiation-sensitive layer to the lenticular sheet, interlayers for thermally insulating multiple color-forming sub-layers from each other, an ultraviolet screening layer having an ultraviolet absorber therein, or other auxiliary layers. To give good protection against ultra-violet radiation, ultra-violet screening layers are desirably provided on both sides of the radiation-sensitive layer; conveniently, one of the ultra-violet screening layers is provided by using as the lenticular sheet a polymer film containing an ultra-violet absorber.

A preferred embodiment of the invention will now be described, though by way of illustration only, with reference to the accompanying drawings. These drawings are not to scale; in particular, the thicknesses of the various sub-layers of the radiation-sensitive layer are greatly exaggerated in FIG. 2 relative to the size of the lenticles shown therein, while in FIG. 1 the size of the lenticles are exaggerated relative to the distance between the imaging medium and the "object" being imaged.

FIG. 1 shows an imaging medium (generally designated 10) comprising a rectangular lenticular sheet 12 formed of a polymeric material and having on its upper surface (as illustrated in FIG. 1) a lenticular screen 14 formed of a plurality of parallel, hemicylindrical lenticles 16a, 16b etc., which run parallel to one edge of the sheet, and perpendicular to the plane of FIG. 1. On the lower surface of the lenticular sheet 12 is provided a radiation-sensitive layer 18.

The imaging medium 10 is shown in FIG. 1 disposed adjacent an "object" 20. As explained above, the present method will normally be used to image a virtual object, not a real one, so that in practice no real object will be present adjacent the imaging medium 10 during imaging, but for purposes of explaining the invention it is convenient to discuss the method as though a real object were present on the lenticular screen side of the imaging medium. The object 20 is accordingly shown in FIG. 1 in broken lines to indicate that it is only a hypothetical object.

FIG. 1 shows the imaging medium 10 as it is being imaged by three infra-red laser beams $hv_1$, $hv_2$ and $hv_3$, which are provided by a laser source, schematically indicated at 22, the laser beams being directed on to the radiation-sensitive layer from below the imaging medium 10 so that they do not pass through the lenticular screen 14. Simultaneously, a beam V of collimated visible radiation is directed on to the lenticular screen 14 perpendicular to the plane of the imaging medium 10. The individual lenticles 16a, 16b etc. focus the beam V, thereby producing, adjacent the lower surface of the imaging medium 10, a region 24 in which the intensity of the visible radiation varies periodically in intensity across the imaging medium 10 with a period equal to the spacing between adjacent lenticles 16a, 16b etc. A linear solid state imager 26 is movable within the region 24 so as to detect the periodic variation in intensity of the visible radiation within this region.

Figure 2:
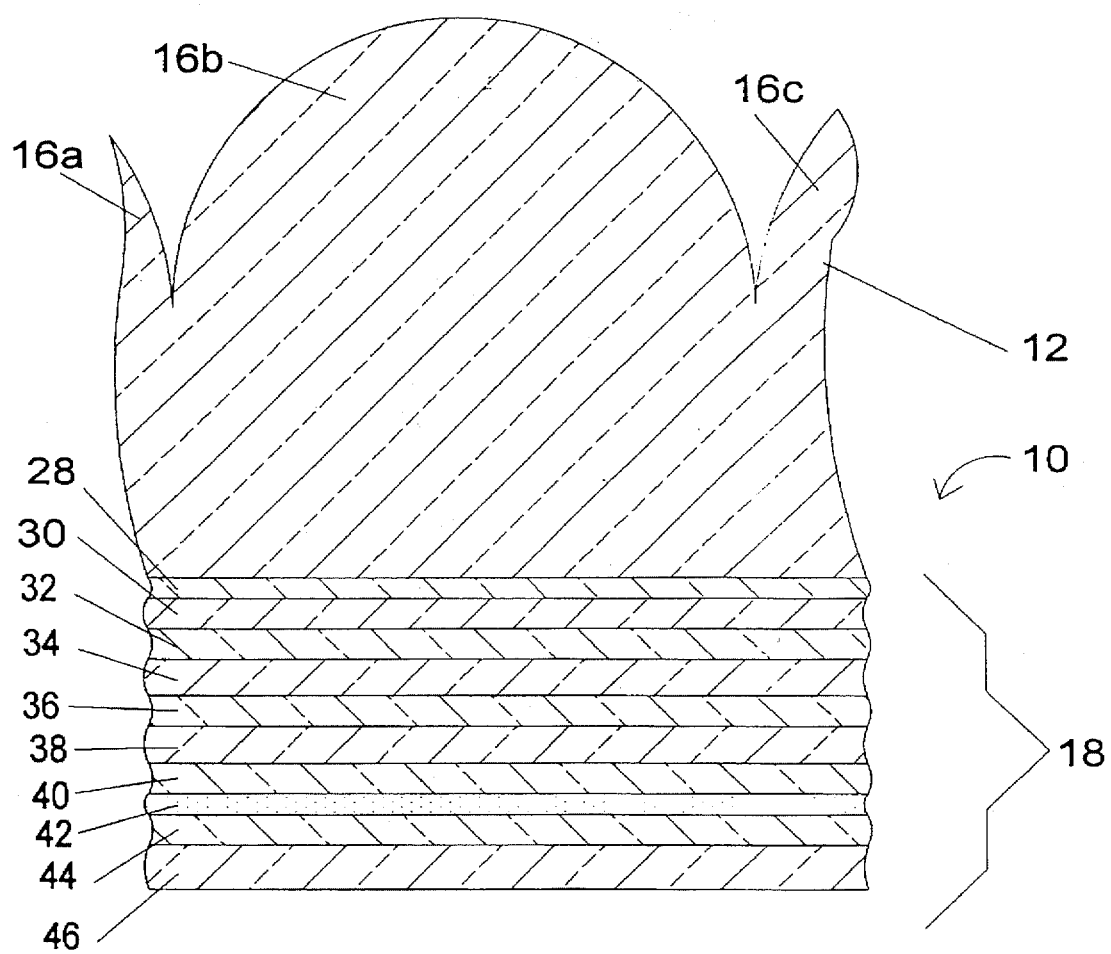
FIG. 2 is an enlarged version of part of FIG. 1 showing details of the radiation-sensitive layer of the imaging medium.

The structure of the radiation-sensitive layer 18 is shown in more detail in FIG. 2. As shown in that Figure, immediately adjacent the lenticular sheet 12 is a diffusion-reducing subcoat 28 approximately 1 µm thick formed from a 10:1 w/w mixture of a water-dispersible styrene acrylic polymer (Joncryl 538 sold by S. C. Johnson & Son, Inc., Racine Wis. 53403) and a water-soluble acrylic polymer (Carboset 526 sold by The B. F. Goodrich Co., Akron Ohio 44313). The presence of the minor proportion of water-soluble acrylic polymer reduces the tendency for the layer 28 to crack during the coating process. The diffusion-reducing subcoat 28, which has a glass transition temperature of approximately 55° C., serves the function of a conventional subcoat, namely increasing the adhesion of the imaging layer 30 (described in detail below) to the lenticular sheet 12. The subcoat 28 also serves to reduce or eliminate migration of dye compound from the imaging layer 30 after imaging; if a conventional subcoat were employed in place of the diffusion-reducing subcoat 28, diffusion of the dye compound from the layer 30 into the subcoat after imaging might cause loss of quality of the image. The subcoat 28 is coated onto the lenticular sheet 12 from an aqueous medium containing the water-dispersible and water-soluble polymers.

A yellow imaging layer 30 is in contact with the diffusion-reducing subcoat 28. This imaging layer 30 is approximately 5 μm thick and comprises approximately 47.5 parts by weight of a leuco dye of the formula:

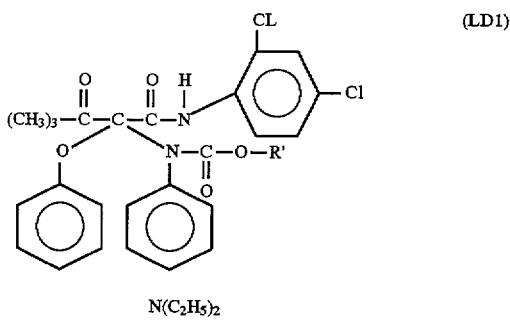

(LD1)

in which R' is a tertiary butyl group (the compounds in which R' is an isobutyl or benzyl group may alternatively be used), 1.6 parts by weight of an infra-red dye of the formula:

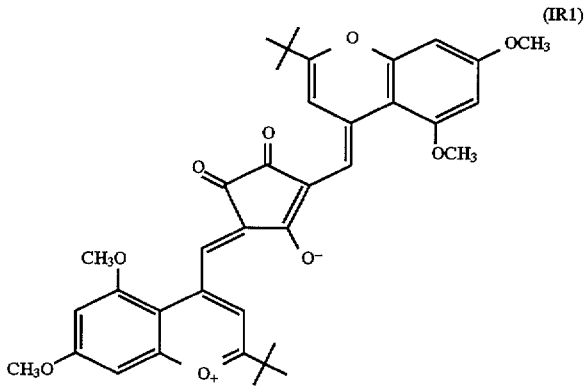

(IR1)

(prepared as described in copending U.S. application Ser. No. 07/795,038, filed Nov. 20, 1991, and the corresponding International Application No. PCT/US91/08695; essentially, this dye is produced by condensing two moles of a 2-(1,1-dimethylethyl)-5,7-dimethoxy-4-methylbenzpyrylium salt with a croconate salt), 3.3 parts by weight of a hindered amine stabilizer (HALS-63, sold by Fairmount Chemical Co.), and 47.5 parts by weight of a poly(methyl methacrylate) binder (Elvacite 2021, sold by DuPont de Nemours, Wilmington, Del.; this material is stated by the manufacturer to be a methyl methacrylate/ethyl acrylate copolymer, but its glass transition temperature approximates that of poly(methyl methacrylate)). This binder has a glass transition temperature of approximately 110° C. The imaging layer 30 is applied by coating from a mixture of heptanes and methyl ethyl ketone.

Superposed on the yellow imaging layer 30 is a diffusion-reducing layer 32, which, like the first diffusion-reducing layer 28, serves to prevent migration of dye compound from the yellow imaging layer 30 on storage after imaging. The diffusion-reducing layer 32, which is approximately 2 μm thick, is formed of a water-dispersible styrene acrylic polymer (Joncryl 138 sold by S. C. Johnson & Son, Inc., Racine Wis. 53403), and is coated from an aqueous dispersion. This layer has a glass transition temperature of approximately 60° C.

The next component of the radiation-sensitive layer 18 is a solvent-resistant interlayer 34 approximately 4.6 μm thick and composed of a major proportion of partially cross-linked polyurethane (NeoRez XR-9637 polyurethane sold by ICI Resins US, Wilmington, Mass.) and a minor proportion of poly(vinyl alcohol) (Airvol 540, sold by Air Products and Chemicals, Inc., Allentown Pa. 18195). This solvent-resistant interlayer 34 is coated from an aqueous dispersion. The interlayer 34 not only helps to thermally insulate the imaging layers 28 and 36 (described below) from one another during imaging, but also prevents disruption and/or damage to the yellow imaging layer 30 and the diffusion-reducing layer 32 during coating of the magenta imaging layer 36. Since the yellow imaging layer 30 and the magenta imaging layer 36 are both coated from organic solution, if a solvent-resistant interlayer were not provided on the layer 30 before the layer 36 was coated, the organic solvent used to coat the layer 36 might disrupt, damage or extract leuco dye or infra-red absorber from the layer 30. Provision of the solvent-resistant interlayer 34, which is not dissolved by and does not swell in the organic solvent used to coat the layer 36, serves to prevent disruption of or damage to the layer 30 as the layer 36 is coated. Furthermore, the solvent-resistant interlayer 34 serves to prevent the magenta leuco dye, infra-red dye and hindered amine light stabilizer from the layer 36 sinking into the diffusion-reducing layer 32 and the yellow imaging layer 30 as the layer 36 is being coated.

Superposed on the solvent-resistant interlayer 34 is the magenta imaging layer 36, which is approximately 3 μm thick and comprises approximately 47.25 parts by weight of a leuco dye of the formula:

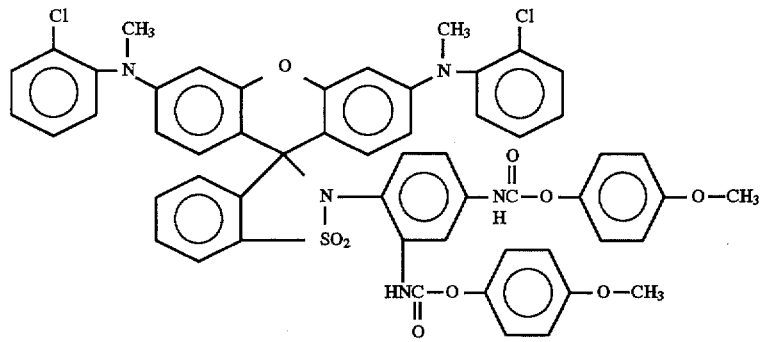

(this leuco dye may be prepared by the methods described in U.S. Pat. Nos. 4,720,449 and 4,960,901), approximately 3.4 parts by weight of zinc acetate (thus giving a leuco dye: zinc cation molar ratio of about 1:0.4), 1.62 parts by weight of an infra-red dye of the formula:

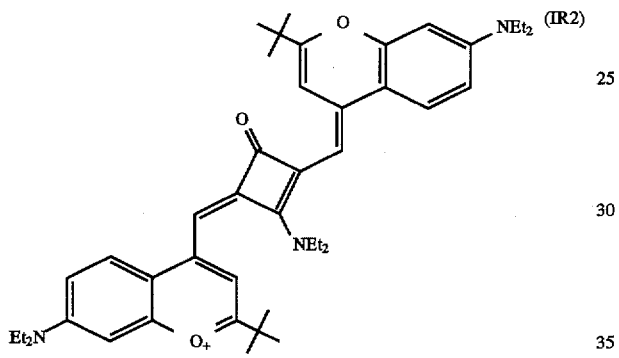

(which may be prepared by the process described in U.S. Pat. No. 5,227,498; essentially, this dye is produced by reacting a compound of the formula:

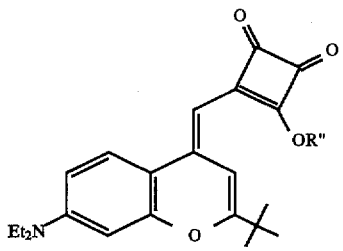

in which R is a halogen atom or an alkyl group, with diethylamine to introduce the -NEt₂ group on the squarylium ring, and then reacting the product with the 4-methylbenzpyrylium salt to give the final infra-red dye of Formula IR2), 3.6 parts by weight of a hindered amine stabilizer (HALS-63), 0.27 parts by weight of a wetting agent, and 47.25 parts by weight of a polyurethane binder (Estane 5715, supplied by The B. F. Goodrich Co., Akron Ohio 44313). The imaging layer 36 is applied by coating from a cyclohexanone/methyl ethyl ketone mixture.

(Alternatively, the infra-red dye of Formula IR2 above may be replaced by the dye of formula:

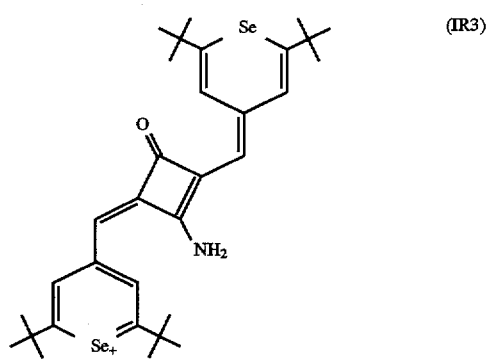

(used in the form of its tetrafluoroborate salt) (this infra-red dye may be prepared by the process analogous to that used to prepare the infra-red dye of Formula IR2 above using the corresponding selenopyrylium squaric acid derivative and ammonia to introduce the amino group, followed by condensation of the product with a selenopyrylium salt; to prepare the selenopyrylium squaric acid derivative, the corresponding selenopyrylium salt is substituted for the benzpyrylium salt).)

On the imaging layer 36 is coated a second solvent-resistant interlayer 38 which is formed from the same material, and coated-in the same manner as, the solvent-resistant interlayer 34.

Superposed on the second solvent-resistant interlayer 38 is a cyan imaging layer 40, which is approximately 3 μm thick and comprises approximately 49.5 parts by weight of a leuco dye of the formula:

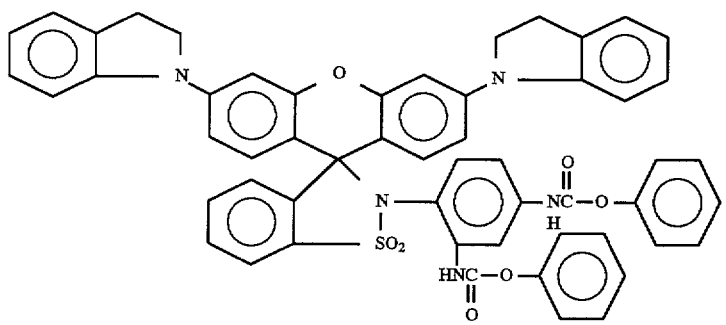

(this leuco dye may by prepared by the methods described in the aforementioned U.S. Pat. Nos. 4,720,449 and 4,960,901), approximately 3.97 grams of zinc acetate (thus giving a leuco dye: zinc cation molar ratio of about 1:0.4), 1.62 parts by weight of an infra-red dye of the formula:

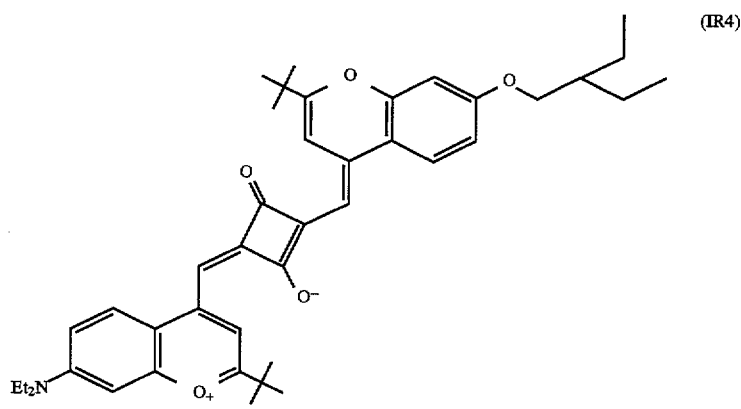

(IR4)

(which is preferably prepared by the process described in copending U.S. Pat. No. 5,231,190; essentially this process comprises reacting a diester, diacid chloride or monoester monoacid chloride of squaric acid with a 2-(1,1-dimethylethyl)7-diethylamino-4-methylbenzpyrylium salt and hydrolysing to produce a benzpyrylium-methylidene compound, and then reacting this compound with a 7-alkoxy-2-(1,1-dimethylethyl)-4-methylbenzpyrylium salt to give the final infra-red dye), 0.2 parts of a wetting agent, and 49.5 parts by weight of a polyurethane binder (Estane 5715). The imaging layer 40 is applied by coating from methyl ethyl ketone.

(Alternatively, the infra-red dye of Formula IR4 above may be replaced by the dye of formula:

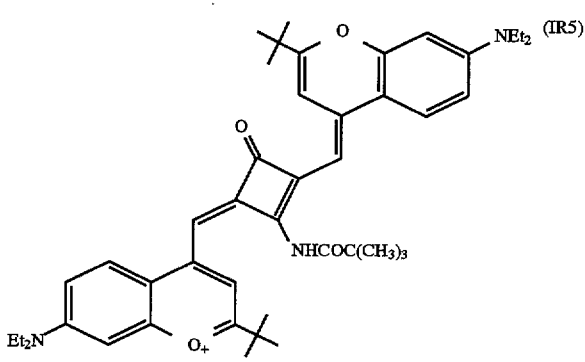

(IR5)

(which may be prepared by a process analogous to that used to prepare the infra-red dye of Formula IR2 above, by reacting the intermediate of Formula V above with ammonia to introduce an amino group on the squarylium ring, then reacting the product with a 4-methylbenzpyrylium salt to produce the amino squarylium dye, and finally reacting this amino squarylium dye with pivaloyl chloride to produce the final pivaloylamino group on the squarylium ring).

As already indicated, the layers 28–40 of the radiation-sensitive layer 18 may be produced by coating on to the lenticular sheet 12. However, the remaining layers of the radiation-sensitive layer 18, namely a transparent bubble-suppressant layer 46, an ultraviolet filter layer 44 and an adhesive layer 42 are not coated on to the lenticular sheet 12 but rather are prepared as a separate unit and then laminated to the remaining layers of the radiation-sensitive layer 18.

The transparent bubble-suppressant layer 46 is a 1.75 mil (44 μm) PET film, a preferred film being that sold as ICI 505 film by ICI Americas, Inc., Wilmington, Del. The bubble-suppressant layer 46 prevents the formation of bubbles in the imaging layers 30, 36 and 40 of the radiation-sensitive layer 18 during imaging.

The ultraviolet filter layer 44 serves to protect the imaging layers 30, 36 and 40 from the effects of ambient ultraviolet radiation. It has been found that the leuco dyes are susceptible to undergoing color changes when exposed to ultraviolet radiation during storage before or after imaging; such color changes are obviously undesirable since they increase the $D_{min}$ of the image and may distort the colors therein. The ultraviolet filter layer 44 is approximately 5 μm thick and comprises approximately 83 percent by weight of a poly (methyl methacrylate) (Elvacite 2043, sold by DuPont de Nemours, Wilmington, Mass.), 16.6 percent by weight of an ultraviolet filter (Tinuvin 328 sold by Ciba-Geigy, Ardsdale N.Y.) and 0.4 percent by weight of a wetting agent. The ultraviolet filter layer 44 is prepared by coating on to the bubble-suppressant layer 46 from a solution in methyl ethyl ketone.

The adhesive layer 42, which is approximately 2 μm thick, is formed of a water-dispersible styrene acrylic polymer (Joncryl 138 sold by S. C. Johnson & Son, Inc., Racine Wis. 53403) and is coated on to the ultraviolet filter layer 44 from an aqueous dispersion.

After the layers 44 and 42 have been coated on to the bubble-suppressant layer 46, the entire structure containing these three layers is laminated under heat (approximately 225° F,. 107° C.) and pressure to the structure containing the layers 12 and 28–40 to form the complete imaging medium 10.

If desired, the bubble-suppressant layer 46 may be formed by coating, rather than by lamination of a pre-formed film on to the layers 28–40. If the bubble-suppressant layer 46 is to be formed by coating, it is convenient to incorporate an ultra-violet absorber into the bubble-suppressant layer, thereby avoiding the need for a separate ultra-violet absorber layer. Thus, in this case, the layer 42 is coated on to the layer 40 using the solvent already described, and then the bubble-suppressant layer 46 containing the ultra-violet absorber may be coated on to the layer 42 from an aqueous medium.

Alternatively, all the layers 28–44 of the imaging medium could be coated on to the bubble-suppressant layer 46, and the resultant structure laminated under heat and pressure to the lenticular sheet 12. In view of the small thickness of the layer 46, the necessary coating operations may be carried out more easily if the layer 46 is first laminated to a suitable strip sheet (say 3 mil (77 μm) thick), and this strip sheet removed from the layer 46 after all the layers 28–46 have been laminated to the lenticular sheet 12.

The medium 10 is imaged by exposing it to the aforementioned beams $hv_1$, $hv_2$ and $hv_3$ (see FIG. 1) from three infra-red lasers having wavelengths of approximately 792, 848 and 926 nm respectively. The 926 nm beam images the yellow imaging layer 30, the 848 nm beam images the magenta imaging layer 36 and the 792 nm beam images the cyan imaging layer 40. Thus, a multicolor image is formed in the radiation-sensitive layer 18, and this multicolor image requires no further development steps. Furthermore, the medium 10 may be handled in normal room lighting prior to exposure, and the apparatus in which the imaging is performed need not be light-tight. As already mentioned, modulation of the laser beams $hv_1$, $hv_2$ and $hv_3$ is controlled by timing circuits which receive the output of the solid state imager 26 so that the image written on the radiation-sensitive layer 18 by the beams $hv_1$, $hv_2$ and $hv_3$ is accurately registered with the lenticles 16a, 16b etc.

Figure 3:
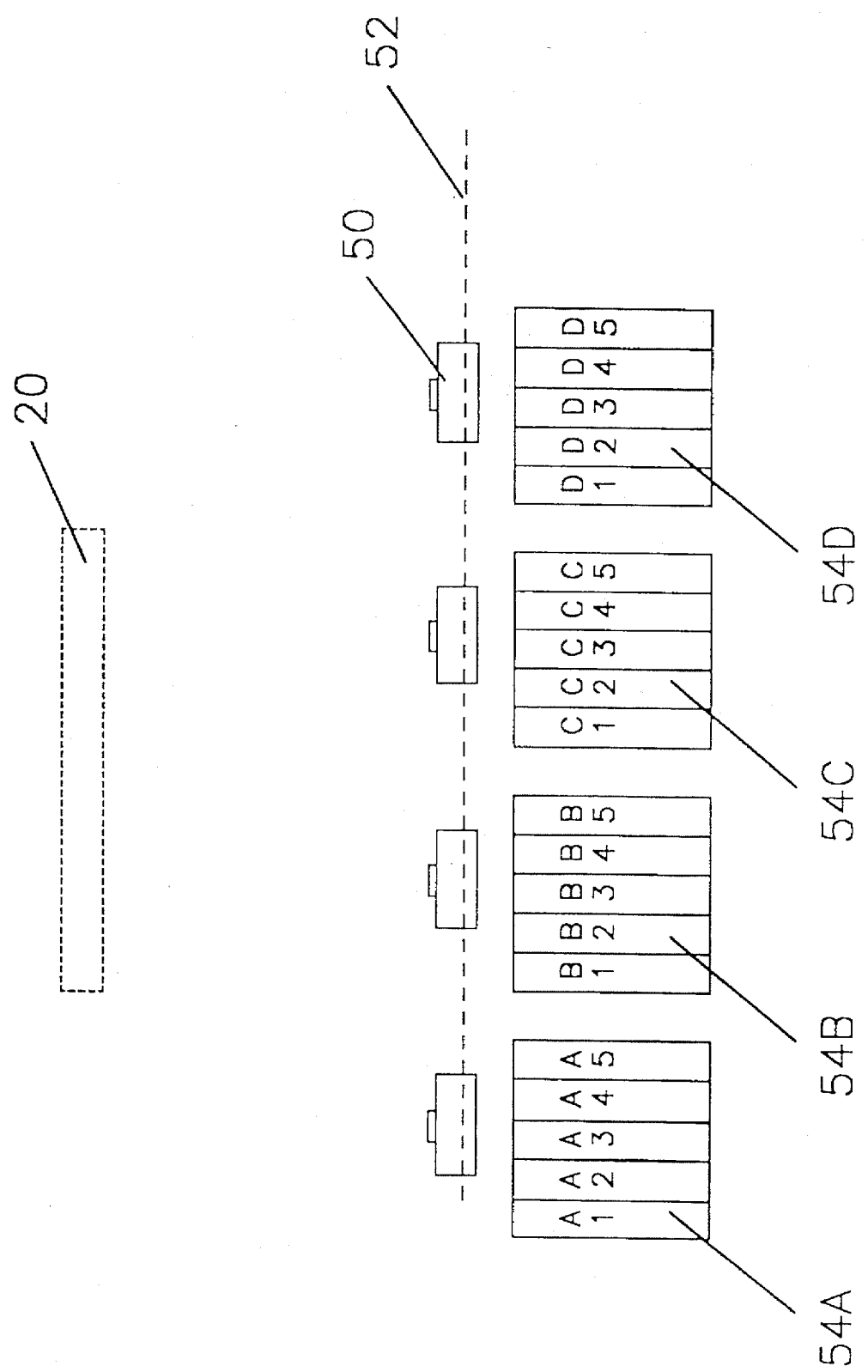
FIGS. 3 and 4 illustrate the manner in which a plurality of images of an object may be produced and combined to effect the three-dimensional imaging method of the present invention.
Figure 4:
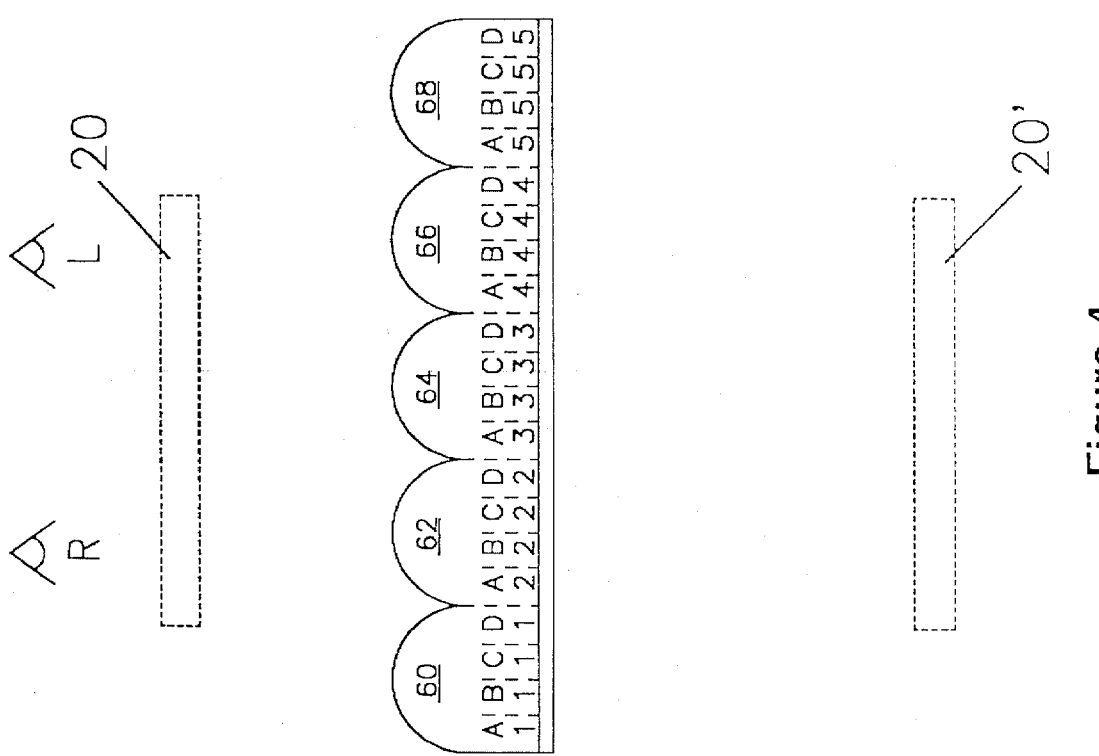

The steps of the method of the present invention are illustrated in FIGS. 3 and 4. For ease of illustration, the present method is illustrated in FIGS. 3 and 4 using only four image strips per image area, although in practice it is desirable to use a greater number of image strips per image area to achieve greater realism in the three-dimensional image seen by the observer. In addition, although FIG. 4 shows the method being applied to a lenticular sheet containing only five lenticles, in practice far more lenticles, typically from 100–300 or more, will be present in the lenticular sheet. Finally, for ease of explanation, FIG. 3 illustrates the invention as applied to a real object, although as explained above the present three-dimensional imaging method will normally be applied to a virtual object, so that the various views of the object shown in FIG. 3 will normally be generated by mathematical manipulation of a virtual object rather than by obtaining an image of a real object. However, it will be apparent to those skilled in the art that there is no essential difference between applying the present methods to images obtained by viewing a real object and applying the same methods to images derived by mathematical manipulation of a virtual object.

FIG. 3 shows a camera 50 with an imaging medium lying in the same plane 52 relative to the object 20 as the radiation-sensitive layer 18 occupies in FIG. 1. The camera 50 is placed at four differing positions in the plane 52, and images 54A, 54B, 54C and 54D are obtained, with image 54A being taken from the leftmost position relative to the object 20 and image 54D being taken from the rightmost position relative to the object. Each of these images 54A, 54B, 54C and 54D are obtained are divided into a number of strips equal to the number of image areas in which the composite image is to be formed (five in FIGS. 3 and 4), the image strips being designated A1–A5, B1–B5, C1–C5 and D1–D5 respectively, each series of image strips being numbered from left to right in FIG. 3.

As shown in FIG. 4, a composite image is formed in the radiation-sensitive layer 18 by assembling the image strips in a particular order. The composite image is to be viewed through the lenticular screen 14 by an observer having left and right eyes L and R respectively. Behind the righthandmost lenticle 60 (as seen by the observer) are assembled strips A1, B1, C1 and D1, these strips being assembled in order from right to left from the observer's viewing direction. Similarly, strips A2, B2, C2 and D2 are assembled behind the next lenticle 62, and similar arrangements of strips are effected behind lenticles 64, 66 and 68, with the lefthandmost lenticle 68 as seen by the observer receiving strips A5, B5, C5 and D5 from the righthand edges of the images 54A, 54B, 54C and 54D respectively.

The composite image thus assembled is written into the radiation-sensitive layer 18 in the manner already described. The observer, seeing this composite image through the lenticular screen 12, will observe an orthoscopic three-dimensional image 20' appearing the same distance behind the plane of the radiation-sensitive layer 18 as the original object 20 lay in front of the plane 52 from which the images 54A, 54B, 54C and 54D were taken.

It will be apparent to those skilled in the imaging art that, if the orthoscopic image thus produced is to retain the correct aspect ratio of the object 20, the widths of the strips present in the composite image must be reduced by a factor of four from the widths of the strips A1–A5, B1–B5, C1–C5 and D1–D5, since the composite image is twenty strips wide, whereas the original images 54A, 54B, 54C and 54D are each only five strips wide. The necessary reduction is width of the strips in the composite image could if desired by effected optically (for example by forming the images 54A, 54B, 54C and 54D using an anamorphic lens), but is more conveniently effected by digital image manipulation, especially when the "images" themselves are created from a virtual object. In a digital image, each of the strips A1–A5, B1–B5, C1–C5 and D1–D5 will comprise a plurality of columns of pixels, and the necessary width reduction can be achieved simply by reducing the number of columns in each strip, for example either by discarding three out of each group of four adjacent columns, or by averaging the four pixels in each row of each group of four adjacent columns, thereby producing a single column of pixels which is an average of the original four adjacent columns.

It will readily be apparent to those skilled in the imaging art that numerous changes and modifications may be made to the specific embodiment of the invention described above without departing the scope of the invention. For example, instead of using hemicylindrical lenticles, lenticles having forms derived from non-spherical surfaces could be used. In addition, numerous changes can be made during the production of the image before it is written on to the radiation-sensitive layer. For example, the object could be distorted by expanding it in one dimension and/or contracting it in another dimension, or certain areas of interest on the object could be highlighted and other areas de-emphasized by omitting such areas entirely or "graying them out".

From the foregoing, it will be seen that the present invention provides a method for the production of a three-dimensional image which is well-adapted to the imaging of virtual objects and which can be effected without the need to make a real copy of the virtual object. The present method does not require elaborate apparatus or time-consuming multiple exposures, and preferred variants of the invention allow the use of special techniques to ensure accurate registration of the image with the lenticular screen.

We claim:

1. A method for printing an image on a lenticular sheet in registration with the lenticles thereof, the image comprising a plurality of image areas each of which is to be printed in register with a lenticle of the lenticular sheet, the method comprising:

providing, on the surface of the lenticular sheet remote from the lenticles, a radiation-sensitive layer, the radiation-sensitive layer being sensitive to radiation of a first wavelength but essentially insensitive to radiation of a second wavelength;

directing a first beam of radiation of the second wavelength on to the surface of the lenticular sheet bearing the lenticles, thereby causing this first beam to pass through the lenticular sheet, and detecting the periodic variation of the radiation on the side of the lenticular sheet bearing the radiation-sensitive layer;

scanning a second beam of radiation of the first wavelength over the radiation-sensitive layer without passing the second beam through the lenticles of the lenticular sheet while modulating the intensity of the second beam, thereby imagewise exposing the radiation-sensitive layer to produce the image, the modulation of the second beam being controlled in dependence upon the detected periodic variation so that each image area of the image is formed in register with a lenticle of the lenticular sheet.

2. A method according to claim 1 wherein the radiation-sensitive layer comprises a color-forming composition adapted to undergo a change of color upon increase in the temperature of the radiation-sensitive layer above a color-forming temperature for a color-forming time.

3. A method according to claim 2 wherein the color-forming composition comprises a material selected from:

a. an organic compound capable of undergoing, upon heating, an irreversible unimolecular fragmentation of at least one thermally unstable carbamate moiety, this organic compound initially absorbing radiation in the visible or the non-visible region of the electromagnetic spectrum, said unimolecular fragmentation visibly changing the appearance of the organic compound;

b. a substantially colorless di- or triarylmethane imaging compound possessing within its di- or triarylmethane structure an aryl group substituted in the ortho position to the meso carbon atom with a moiety ring-closed on the meso carbon atom to form a 5- or 6-membered ring, said moiety possessing a nitrogen atom bonded directly to said meso carbon atom and said nitrogen atom being bound to a group with a masked acyl substituent that undergoes fragmentation upon heating to liberate the acyl group for effecting intramolecular acylation of said nitrogen atom to form a new group in the ortho position that cannot bond to the meso carbon atom, whereby said di- or triarylmethane compound is rendered colored;

c. a colored di- or triarylmethane imaging compound possessing within its di- or triarylmethane structure an aryl group substituted in the ortho position to the meso carbon atom with a thermally unstable urea moiety, said urea moiety undergoing a unimolecular fragmentation reaction upon heating to provide a new group in said ortho position that bonds to said meso carbon atom to form a ring having 5 or 6 members, whereby said di- or triarylmethane compound becomes ring-closed and rendered colorless;

d. in combination, a substantially colorless di- or triarylmethane compound possessing on the meso carbon atom within its di- or triarylmethane structure an aryl group substituted in the ortho position with a nucleophilic moiety which is ring-closed on the meso carbon atom, and an electrophilic reagent which upon heating and contacting said di- or triarylmethane compound undergoes a bimolecular nucleophilic substitution reaction with said nucleophilic moiety to form a colored, ring-opened di- or triarylmethane compound;

e. a compound of the formula

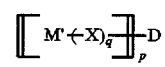

wherein M' has the formula:

wherein R is alkyl; —SO$_2$R$^1$ wherein R$^1$ is alkyl; phenyl; naphthyl; or phenyl substituted with alkyl, alkoxy, halo, trifluoromethyl, cyano, nitro, carboxy, —CONR$^2$R$^3$ wherein R$^2$ and R$^3$ each are hydrogen or alkyl, —CO$_2$R$^4$ wherein R$^4$ is alkyl or phenyl, —COR$^5$ wherein R$^5$ is amino, alkyl or phenyl, —NR$^6$R$^7$ wherein R$^6$ and R$^7$ each are hydrogen or alkyl, —SO$_2$NR$^8$R$^9$ wherein R$^8$ and R$^9$ each are hydrogen, alkyl or benzyl; Z' has the formula:

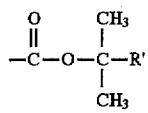

wherein R' is halomethyl or alkyl; X is —N=, —SO₂— or —CH₂—; D taken with X and M' represents the radical of a color-shifted organic dye; q is 0 or 1; and p is a whole number of at least 1; said Z' being removed from said M' upon the application of heat to effect a visually discernible change in spectral absorption characteristics of said dye;

f. a substantially colorless di- or triarylmethane compound of the formula:

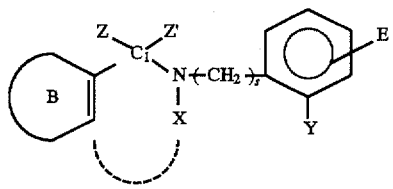

wherein ring B represents a carbocyclic aryl ring or a heterocyclic aryl ring; $C_1$ represents the meso carbon atom of said di- or triarylmethane compound; X represents —C(=O)—; —SO₂— or —CH₂— and completes a moiety ring-closed on said meso carbon atom, said moiety including the nitrogen atom bonded directly to said meso carbon atom; Y represents —NH—C(=O)—L, wherein L is a leaving group that departs upon thermal fragmentation to unmask —N=C=O for effecting intramolecular acylation of said nitrogen atom to open the N-containing ring and form a new group in the ortho position of ring B that cannot bond to said meso carbon atom; E is hydrogen, an electron-donating group, an electron-withdrawing group or a group, either an electron-donating group or an electron-neutral group that undergoes fragmentation upon heating to liberate an electron-withdrawing group; s is 0 or 1; and Z and Z' taken individually represent the moieties to complete the auxochromic system of a diarylmethane or triarylmethane dye when said N-containing ring is open, and Z and Z' taken together represent the bridged moieties to complete the auxochromic system of a bridged triarylmethane dye when said N-containing ring is open;

g. a colorless precursor of a preformed image dye substituted with (a) at least one thermally removable protecting group that undergoes fragmentation from said precursor upon heating and (b) at least one leaving group that is irreversibly eliminated from said precursor upon heating, provided that neither said protecting group nor said leaving group is hydrogen, said protecting and leaving groups maintaining said precursor in its colorless form until heat is applied to effect removal of said protecting and leaving groups whereby said colorless precursor is converted to an image dye;

h. mixed carbonate ester of a quinophthalone dye and a tertiary alkanol containing not more than about 9 carbon atoms i. a leuco dye represented by:

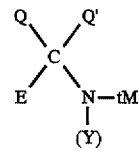

wherein:

E represents a thermally removable leaving group;

tM represents a thermally migratable acyl group;

Q, Q' and C taken together represent a dye-forming coupler moiety wherein C is the coupling carbon of said coupler moiety;

and, (Y) taken together with N represents an aromatic amino color developer, one of said Q, Q' and (Y) containing an atom selected from the atoms comprising Group 5A/Group 6A of the Periodic Table, said groups E and tM maintaining said leuco dye in a substantially colorless form until the application of heat causes said group E to be eliminated from said leuco dye and said group tM to migrate from said N atom to said Group 5A/Group 6A atom thereby forming a dye represented by:

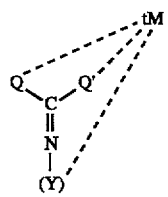

wherein said dotted lines indicate that said tM group is bonded to said Group 5A/Group 6A atom in one of said Q, Q' and (Y).

4. A method according to claim 1 wherein the first wavelength in the range of from about 700 to about 1200 nm, and the second wavelength is in the visible region.

* * * * *